United States Patent
Iyer et al.

(10) Patent No.: US 6,888,212 B2
(45) Date of Patent: May 3, 2005

(54) METHOD FOR TRENCH ISOLATION BY SELECTIVE DEPOSITION OF LOW TEMPERATURE OXIDE FILMS

(75) Inventors: Ravi Iyer, Boise, ID (US); Gurtej Sandhu, Boise, ID (US); Pai Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/254,756

(22) Filed: Sep. 24, 2002

(65) Prior Publication Data

US 2003/0027401 A1 Feb. 6, 2003

Related U.S. Application Data

(62) Division of application No. 09/041,984, filed on Mar. 13, 1998, now Pat. No. 6,455,394, which is a continuation of application No. 08/916,526, filed on Aug. 22, 1997, now abandoned.

(51) Int. Cl.[7] .............................................. H01L 21/208
(52) U.S. Cl. ....................................... 257/506; 438/428
(58) Field of Search ................................ 257/374, 501, 257/506, 510; 438/424, 427, 428, 431

(56) References Cited

U.S. PATENT DOCUMENTS 4,502,914 A    3/1985  Trumpp et al.
5,028,566 A    7/1991  Lagendijk (Continued)

FOREIGN PATENT DOCUMENTS

GB    WO 94/01885    * 1/1994    ......... H01L/21/316
JP    56043743 A     * 4/1981    ......... H01L/21/90
JP    59058837 A     * 4/1984    ......... H01L/21/76

OTHER PUBLICATIONS

Encyclopedia of Chemical Technology, Kirk–Othmer, vol. 11. pp; 791–792.
"Isolation Technologies for Integrated Circuits", Silicon Processing for the VLSI ERA, vol. II. pp. 12–83.
Kiermasz et al Planarisation for Sub Micron Devices Utilising a New Chemistry DUMIC Conference 1995.
McClatchie et al Low Dielectric Constant Flowfill Technology for IMD Applications undated.
Beekman et al Sub–Micron Gap Fill and In–Situ Planarisation Using Flowfill Technology ULSI Conference 1995.
Stanley Wolf Silicon Processing for the VSLI Era vol. 2 Lattice Press p. 215, 1990.

*Primary Examiner*—Carl Whitehead, Jr.
*Assistant Examiner*—Jennifer M Dolan
(74) *Attorney, Agent, or Firm*—Knobbe, Martens, Olson & Bear, LLP

(57) ABSTRACT

A method of forming isolation regions in a silicon substrate comprising the steps of forming a trench in the silicon substrate, filling the trench with a silanol polymer material then heating the silanol polymer material so that silicon dioxide is formed in the trench and thereby forms the isolation region. In the preferred embodiment, the silicon substrate is covered by a masking stack which is then etched to expose the underlying silicon substrate. The silicon substrate is then etched to form the trench and the silanol polymer material is deposited in the trench and fills the trench from the bottom up thereby avoiding divots and other defects. The silanol polymer grows faster on the silicon substrate than it does on the nitride. After the silanol polymer is reacted to form the silicon dioxide, CMP polishing is then used to remove the remaining masking stack and silicon dioxide above the surface of the silicon substrate.

5 Claims, 6 Drawing Sheets

U.S. PATENT DOCUMENTS

| | | | |
|---|---|---|---|
| 5,087,586 A | | 2/1992 | Chan et al. |
| 5,156,881 A | | 10/1992 | Okano et al. |
| 5,169,491 A | | 12/1992 | Doan |
| 5,191,509 A | | 3/1993 | Wen |
| 5,302,233 A | | 4/1994 | Kim et al. |
| 5,366,590 A | | 11/1994 | Kadomura |
| 5,470,783 A | | 11/1995 | Chiu et al. |
| 5,470,798 A | | 11/1995 | Ouellet |
| 5,516,721 A | * | 5/1996 | Galli et al. .................. 438/424 |
| 5,530,293 A | | 6/1996 | Cohen et al. |
| 5,565,376 A | * | 10/1996 | Lur et al. .................... 438/427 |
| 5,719,085 A | | 2/1998 | Moon et al. |
| 5,763,954 A | | 6/1998 | Hyakutake |
| 5,776,557 A | | 7/1998 | Okano et al. |
| 5,786,039 A | * | 7/1998 | Brouquet .................... 427/578 |
| 5,811,849 A | * | 9/1998 | Matsuura .................... 257/306 |
| 5,851,900 A | * | 12/1998 | Chu et al. ................... 438/434 |
| 5,883,006 A | | 3/1999 | Iba |
| 5,985,770 A | * | 11/1999 | Sandhu et al. .............. 438/787 |
| 6,030,881 A | | 2/2000 | Papasouliotis et al. |
| 6,051,477 A | | 4/2000 | Nam |

* cited by examiner

METHOD FOR TRENCH ISOLATION BY SELECTIVE DEPOSITION OF LOW TEMPERATURE OXIDE FILMS

RELATED APPLICATIONS

This application is a divisional of prior U.S. patent application Ser. No. 09/041,984, filed Mar. 13, 1998, issued as U.S. Pat. No. 6,455,394 on Sep. 24, 2002, and which is a continuation of U.S. patent application Ser. No. 08/916,526, filed Aug. 22, 1997, now abandoned.

BACKGROUND OF THE INVENTION

1. Field of the Invention

This invention generally relates to semiconductor integrated device design and fabrication and, more particularly, to processes for isolating devices using trench isolation techniques.

2. Description of the Related Art

As semiconductor integrated circuit technology advances to Ultra Large Scale Integration (ULSI) technologies, the devices on the wafers shrink to sub-micron dimensions and the circuit density increases to several million devices per chip. As such, the manufacturability and reliability of these sub-micron dimensioned devices are of great importance to the semiconductor industry and have received increasing attention recently.

For a given chip size, an increase in the number of active circuit components, i.e., active devices, typically requires that the devices be placed in close proximity to each other, thus forcing a corresponding reduction in the surface area of the circuit that can be occupied by electrical isolation structures. It is understood that active devices on a chip surface often have to be electrically isolated from adjacent devices to prevent adjacent devices from altering the operation of other adjacent devices. The trend for reducing the chip surface area consumed by electrical isolation structures, while maintaining the necessary electrical isolation of adjacent active components, has led to the development of several different techniques for isolating devices in a manner that reduces the surface space occupied by isolation structures.

The most common isolation fabrication technique is a process known as LOCOS (for LOCalized Oxidation of Silicon). In the LOCOS process, regions of the substrate are oxidized to form isolation structures known as field oxide regions, which separate adjacent active areas that will contain active devices. In the conventional LOCOS technique, the process typically begins with the growth of a thin pad oxide layer over the wafer surface. In general, this pad oxide layer is a layer of $SiO_2$ (silicon dioxide) and is relatively thin. Following this, a thicker layer of silicon nitride mask is deposited on top of the pad oxide layer and lithographically defined to retain the nitride over the active device regions of the wafer. The nitride layer is etched from the area between the active device areas where the field oxide (silicon dioxide) is then thermally grown.

Although the LOCOS process offers high reliability and proven high volume manufacturing compatibility, this technique has some well-known disadvantages. The first disadvantage of the process is the problem of active area loss due to lateral encroachment of the growing field oxide. In semiconductor technology, this problem is known as "bird's beak" encroachment and it is the result of lateral diffusion of the oxidants at the edges of the nitride masking stack. The bird's beak encroachment causes the oxide layer to grow under the nitride masking stack and limits the usable active device areas. Thus, a large area on the chip is lost after the field oxidation is complete.

Another limitation of LOCOS isolation technologies for sub-micron structures is a phenomenon often referred to as "Kooi" effect or "white ribbon" effect. The Kooi effect occurs during the field oxide growth step where a thin silicon nitride layer can also form on the silicon surface at the pad oxide/silicon interface as a result of the reaction of ammonia ($NH_3$) and silicon. The ammonia is generated from the reaction between water vapor and the masking nitride during the field oxidation step. Subsequently, when the gate oxide is grown, the growth rate becomes impeded at the locations where the silicon nitride has formed. The gate oxide is thus thinner at these locations than elsewhere, causing low-voltage breakdown of the gate oxide. One common way to eliminate this problem is to grow a sacrificial oxide layer after the masking stack etch. The sacrificial oxide is then removed before growing the final gate oxide. However, the additional process steps involved for eliminating the Kooi effect add to the cost and complexity of ULSI fabrication.

Such disadvantages of the conventional LOCOS process motivated the development of alternative isolation approaches. Among a few other isolation technologies, which have focussed their efforts on eliminating the bird's beak and the Kooi effects, the "trench isolation" technique can be considered as an alternative isolation technology to the LOCOS process. In this technique, the field oxide regions are basically formed by etching trenches into the silicon substrate, so as to define the field oxide regions, and subsequently filling the trenches with a CVD (chemical vapor deposited) oxide, such as $SiO_2$.

An exemplary trench isolation technique initially begins with depositing a suitable masking material on top of a substrate. A typical masking material may comprise a photoresist, silicon nitride, silicon dioxide or combinations thereof. The masking stack is then etched to define the locations on the substrate where the trenches are to be formed. Subsequently, trenches of varying widths and depths are anisotropically etched into the silicon substrate through the patterned masking layer. A CVD oxide, preferably a layer of $SiO_2$, is then deposited over the wafer, which completely fills the trenches and covers the top of the masking stack. The CVD oxide deposition is followed by an etchback process to etch the masking stack and the excessive CVD-oxide from the surface of the substrate. During the etchback process, the masking stack and the CVD-oxide are dry etched at the same rate to retain the CVD-oxide only in the trenches and to level its top surface with the original surface of the silicon substrate. Consequently, the field isolation regions produced by the trench isolation technique provide a significantly planar isolation layer while eliminating the bird's beak and the Kooi effect.

However, as device dimensions become smaller and trench widths become narrower, the trenches refilled by current CVD techniques fail to provide defect free field oxide isolation layers. As described above, the CVD-oxide refill process proceeds by means of a conformal oxide covering of both the trench surfaces and the top of the masking layers. In the trenches, the conformal layers of oxide are initially formed on the side walls and they are grown in size outward into the center of the trench to where the oxide layers meet.

Unfortunately, as the surfaces of the two oxide layers formed on the opposite side walls meet in the center of the trench to close and fill the trench, voids or a seam line can begin to form between the two meeting surfaces. These voids and seam lines are defective formations which can greatly affect the stress distribution in the oxide filling the trenches and create localized stress points which can be etched faster than the rest of the oxide filling the trenches during subsequent etch steps of the wafer.

As a result, divots or a non-planar surface may form during the subsequent processing steps thereby impairing the isolation capability of the isolation layer. Moreover, if the trenches of widely varying widths are filled, the narrow trenches must be over-filled in order for the wider trenches to be filled completely. Thus, the thickness of the top-surface-deposited film will vary making planarization very difficult. This problem is particularly difficult in ULSI applications where the isolation regions are so small. Hence, there is a need in current semiconductor technology for improved techniques to eliminate the problems occurring during trench isolation processes. To this end, there is a need for improved trench isolation techniques which provide a more defect free isolation structure and more planar field oxide regions.

SUMMARY OF THE INVENTION

The aforementioned needs are satisfied by the process of the present invention which comprises forming a trench in a semiconductor substrate, depositing an isolation precursor material into the trench and then reacting the isolation precursor material so that it transforms into an isolation material in the trench. Preferably, the isolation precursor material fills the trench from the bottom surface up to the top of the trench and thereby avoids forming seams in the center of the trench.

Preferably, the trench is formed by forming a nitride stack over a silicon wafer and then patterning and etching the nitride to expose regions of the wafer. The wafer in the exposed regions are then etched to form the trench. Preferably, a trench is formed around the active areas of the wafer and an isolation structure is formed in the trench.

Specifically, the isolation precursor material, which is preferably a material that exhibits liquid like tendencies, fills the trench. The isolation precursor material is then treated so that it is densified, e.g., is hardened and dried, into a material suitable for isolating active areas. In one embodiment, the isolation precursor material is a silanol polymer material that, when heated, is transformed into silicon dioxide and evaporated water.

The silanol polymer material also is deposited faster on the silicon substrate than on the masking stack further reducing the likelihood of defects forming in the subsequently formed isolation regions. Once the isolation region is formed, silicon dioxide on the top of the masking stack, the masking stack and the silicon dioxide positioned immediately above the trench can be removed using, for example, chemical mechanical polishing (CMP).

Hence, the process results in isolation structures in the form of an isolation material in a trench surrounding an active area where there is an isolating material formed in the trench. This structure has reduced defects and has a conformal upper surface which further improves the isolation performance. These and other objects and advantages will become more apparent from the following description taken in conjunction with the accompanying drawings.

DETAILED DESCRIPTION OF THE PREFERRED EMBODIMENT

Reference will now be made to the drawings wherein like numerals refer to like parts throughout. As will be described hereinbelow, the process of the preferred embodiment provides a method to form a trench isolation structure by selectively depositing a low temperature oxide precursor into a trench and subsequently densifying it.

Figure 1:
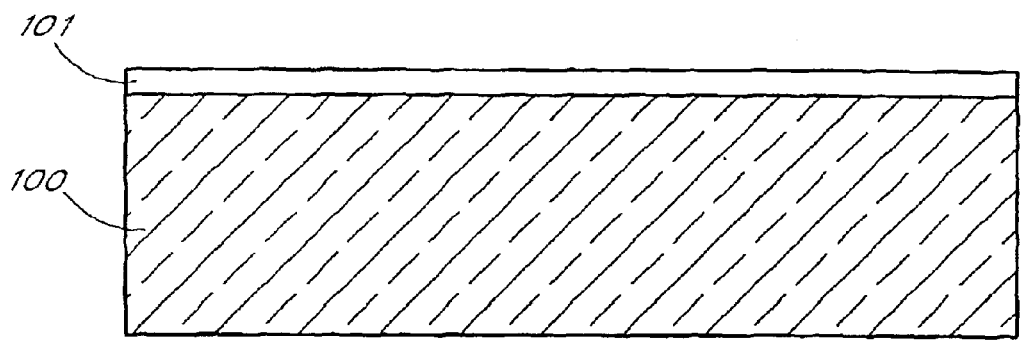
FIG. 1 is a cross-sectional view of a portion of a silicon wafer having a pad oxide layer grown on the top side of the wafer.

As shown in FIG. 1, an exemplary process of the preferred embodiment begins by growing a stress relief buffer layer 101 on a clean surface on a silicon wafer 100. Preferably, this stress relief buffer layer 101 is comprised of a thin layer of silicon dioxide ($SiO_2$) 101 that is about 100-200 Å thick. This $SiO_2$ layer is generally known as pad oxide and provides a stress-relief buffer between the surface silicon substrate 100 and layers subsequently deposited on the pad oxide.

Figure 2:
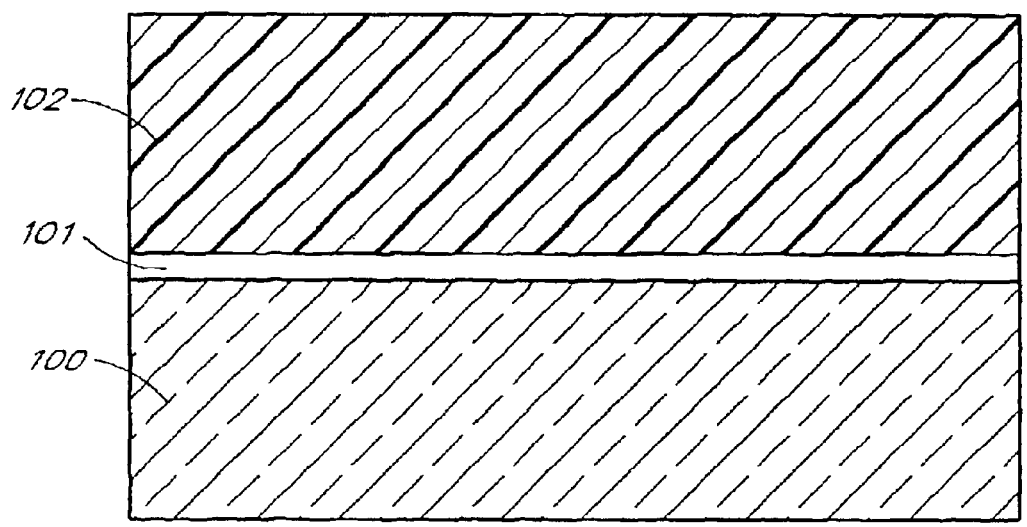
FIG. 2 is a cross-sectional view of the wafer shown in FIG. 1 wherein a layer of silicon nitride has been deposited on the top of the pad oxide layer.

Specifically, FIG. 2 illustrates that a layer of masking material, preferably silicon nitride 102, is deposited on the pad oxide layer 101. In one preferred embodiment, the silicon nitride layer 102 is approximately 2000 Å thick. As is understood in the art, silicon nitride is essentially a masking material which is used for the formation of field oxide isolation regions on the substrate 100. Silicon nitride is typically deposited by a chemical vapor deposition (CVD) of dichlorosilane ($SiH_2Cl_2$) and ammonia ($NH_3$) at temperatures between 700° C. and 800® C.

Figure 3:
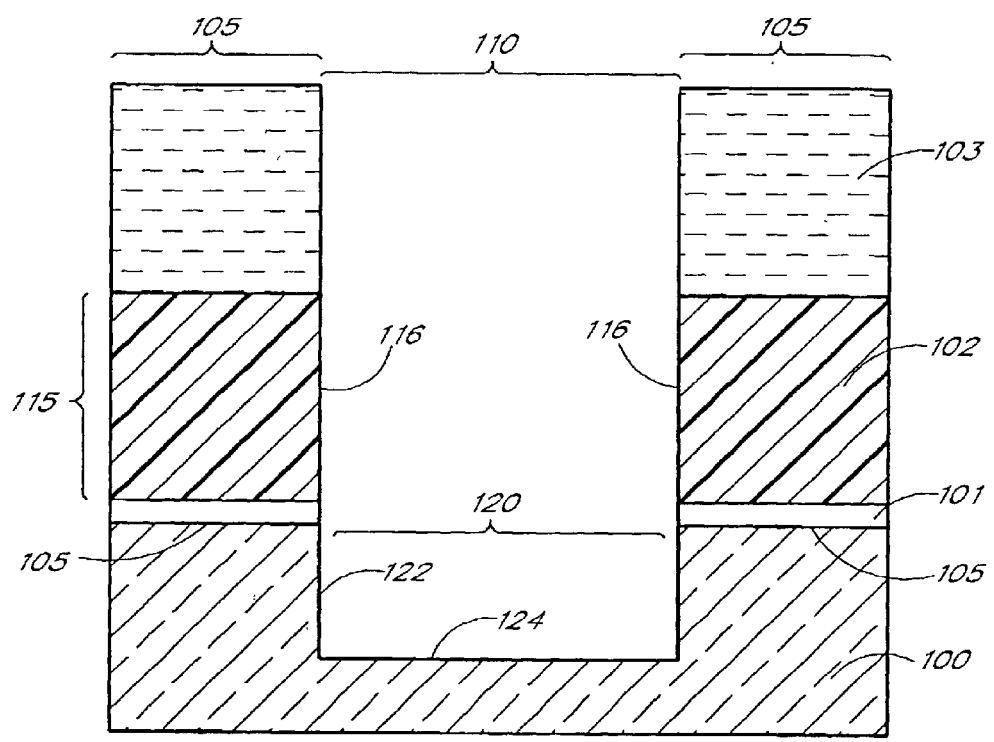
FIG. 3 is a cross-sectional view of the wafer shown in FIG. 2 wherein the nitride masking stack has been patterned and etched to form trenches in the substrate.

As shown in FIG. 3, the process is followed by the patterning of the silicon nitride masking layer 102, preferably by deposition of a photoresist mask 103 which is then selectively etched so as to expose regions of the masking layer 102 that are to be etched along with the buffer layer 101 and portions of the underlying substrate 100 to form a trench formation 110. The trench formation 110 includes a trench structure 120, having a floor 124 and two side walls 122, that is formed in the underlying substrate 100 and an upper trench portion 116 having side walls 150, that is formed in the masking material 103.

Preferably, an anisotropic plasma etch is used to remove portions of the pad oxide layer 101 and the nitride layer 102 in the regions where the photoresist layer 103 has been removed. Further, use of this etching process also creates the trench structure 120, which is preferably formed in the silicon substrate 100 where the isolation structure regions will be formed. It will be appreciated that, using the techniques of the preferred embodiment described herein, the width of the trench can be as narrow as 0.1 μm which facilitates use of this process for producing isolation structures for devices in ULSI applications.

Figure 4A:
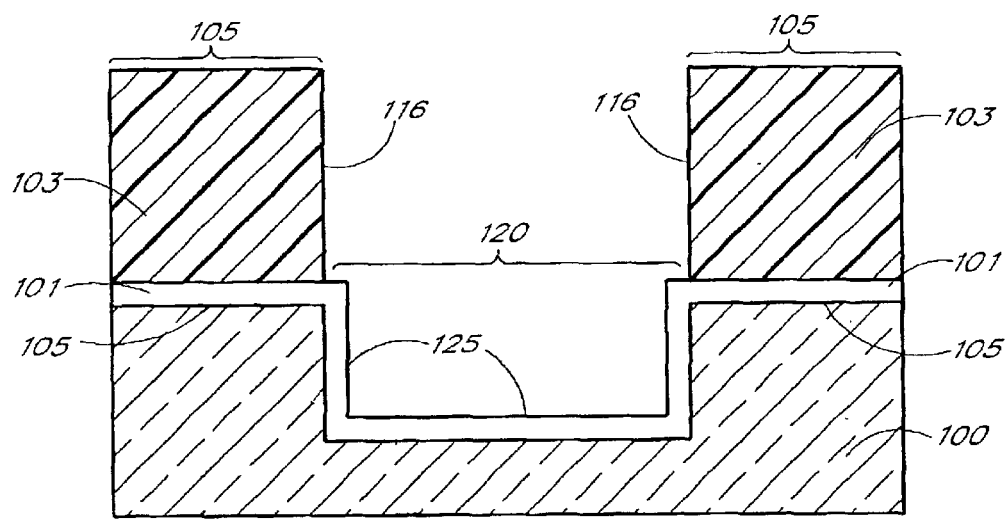
FIG. 4A is a cross-sectional view of the wafer shown in FIG. 3 wherein a silicon dioxide layer has been grown in the trench side-walls and the floor.
Figure 4B:
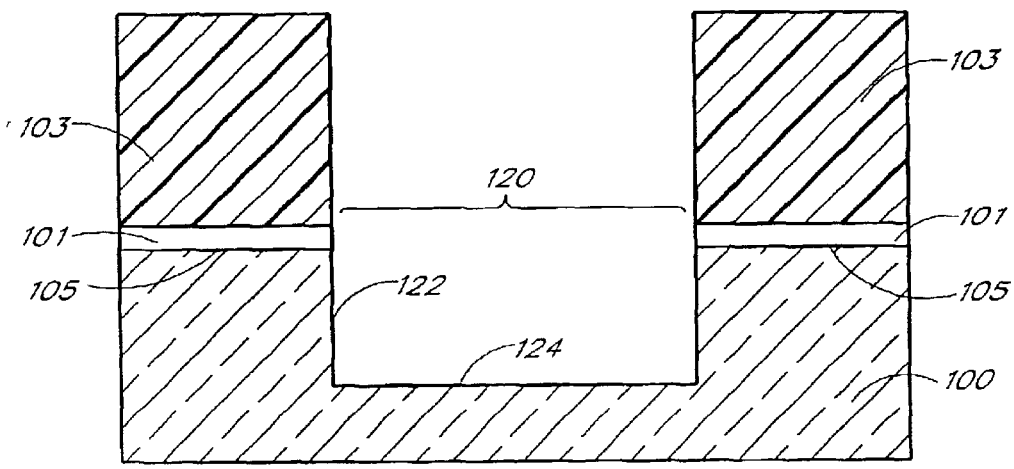
FIG. 4B is a cross-sectional view of the wafer shown in FIG. 3 wherein the silicon dioxide layer has not been grown.

As illustrated in FIG. 4A, following the anisotropic plasma etch, the photoresist mask 103 is preferably removed from the masking stack 102 on top of the future active areas 105 of the wafer. However, as is shown in FIG. 4A, at this step, a thin layer of silicon dioxide 125 may be grown on the floor 124 and the side walls 122 of the trenches 120 formed in the substrate 100. As is understood in the art, this thin silicon dioxide layer 125 is usually grown to passivate the silicon forming the side-walls 122 and floor 124 of the trench 120 and to smooth these regions to prevent defect formations during future processing steps. However, as will be described hereinbelow, the improved isolation technique of the preferred embodiment will not necessarily require the growth of this additional passivation layer 125 in every application, so that growth of the layer 125 may be omitted, as shown in FIG. 4B, or included, depending upon the application.

Figure 5A:
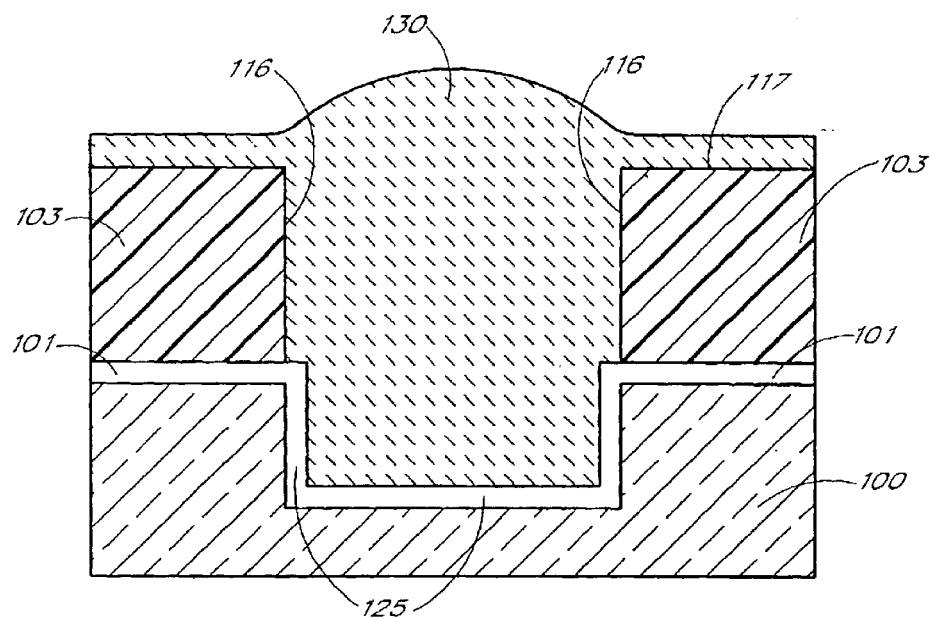
FIG. 5A is a cross-sectional view of the wafer of FIG. 4A, wherein a low temperature oxide precursor has been deposited into the trench.
Figure 5B:
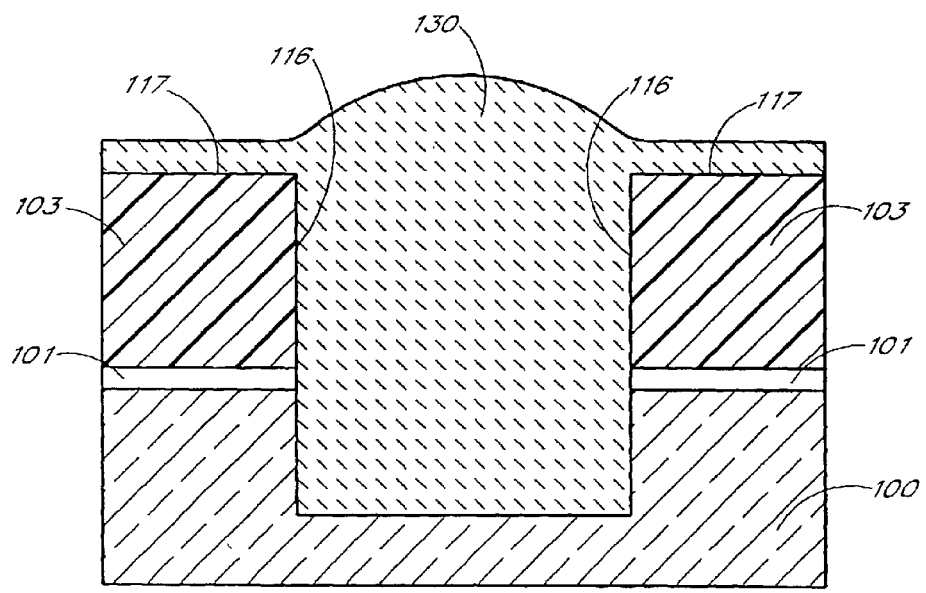
FIG. 5B is a cross-sectional view of the wafer of FIG. 4B, wherein a low temperature oxide precursor has been deposited into the trench.

As illustrated in FIGS. 5A and 5B respectively, a layer of isolation precursor material 130, which in this embodiment is preferably a silanol polymer (Si(OH)$_4$), is then selectively deposited over the wafer portions 100 having the trenches 120. In this embodiment, the selective deposition of the silanol polymer (Si(OH)$_4$) 130 is preferably performed at 0° C. by reacting SiH$_4$ (silane) with H$_2$O$_2$ (hydrogen peroxide) according to the overall polymerization reaction:

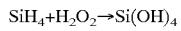

Due to its selectivity for silicon and silicon dioxide, during deposition the silanol polymer deposits on either the silicon substrate 100 (FIG. 5B) or the silicon dioxide passivation layer 125 (FIG. 5A) with a higher growth rate than on the nitride masking material 102. Thus the growth rate of the silanol polymer 130 in the french structure 1.20 within the silicon substrate 100, with either the silicon or silicon dioxide side walls 122 and the floor 124, is higher than the growth rate in the upper trench 116 formed in the nitride material 102.

Further, as opposed to the prior art trench isolation techniques that use CVD deposited oxides to fill the trenches, the silanol polymer 130 fills the trench by behaving like a liquid filling a container, i.e., from the bottom to the top. In the prior art, the CVD-oxide deposition results in the oxide being deposited conformally, i.e., substantially equally on all of the surfaces, including the sidewalls. This can cause localized stress points where the conformal layers of oxide material meet which can be etched faster than the rest of the isolation structure during subsequent processing causing non-planarity and divots on the isolation layer surface. Such problems impair the isolation characteristics of the field oxide regions and cause conduction between adjacent devices.

The silanol polymer material 130, however, does not suffer from these limitations. Its liquid-like nature forms a homogeneous filler material in the trench 110 and prevents localized stress points. The combined effect of the deposition selectivity and the liquid-like behavior of the silanol polymer 130 allows it to grow vertically and fill the entire trench volume before any significant silanol deposition on the top 117 of the nitride layer 102. Since deposition of the isolation precursor material 130 on the top surface 117 is minimized, the subsequent planarization steps of the wafer are greatly simplified. In particular, the trenches of widely varying widths may be filled simultaneously with the filler isolation precursor material 130, there is minimal void formation, and the refill process is insensitive to the trench profile, i.e., the shape of the trench may vary.

After being deposited, in the preferred embodiment the silanol precursor layer 130 is densified, e.g., is dehydrated or is desiccated. The moisture (H$_2$O) from the film is driven off by a dehydration process preferably occurring between 400–900° C. according to the general dehydration reaction:

Figure 6A:
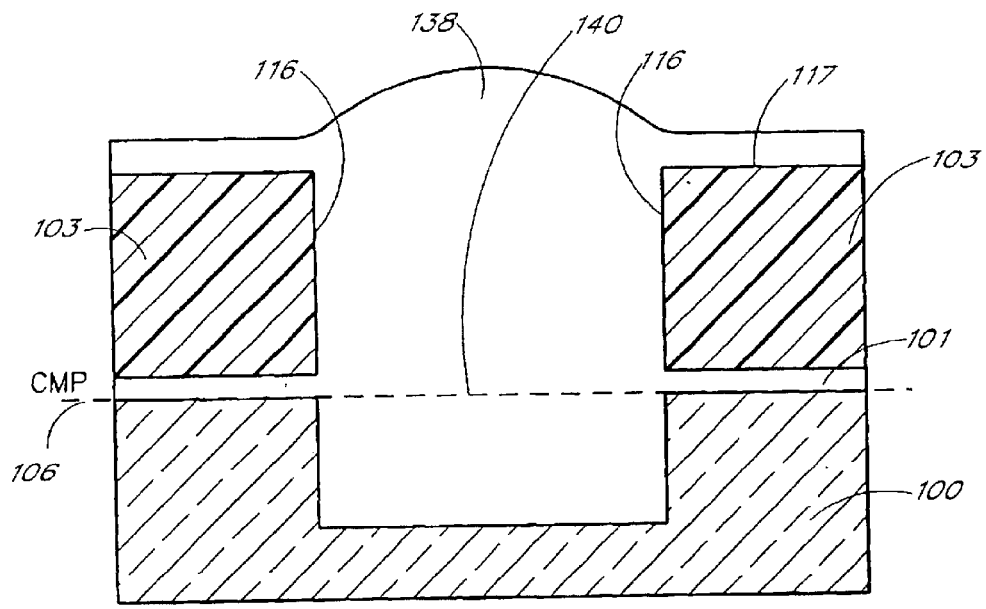
FIG. 6A is a cross-sectional view of the wafer of FIG. 5A, wherein the low temperature oxide precursor has been transformed into an oxide isolation material.
Figure 6B:
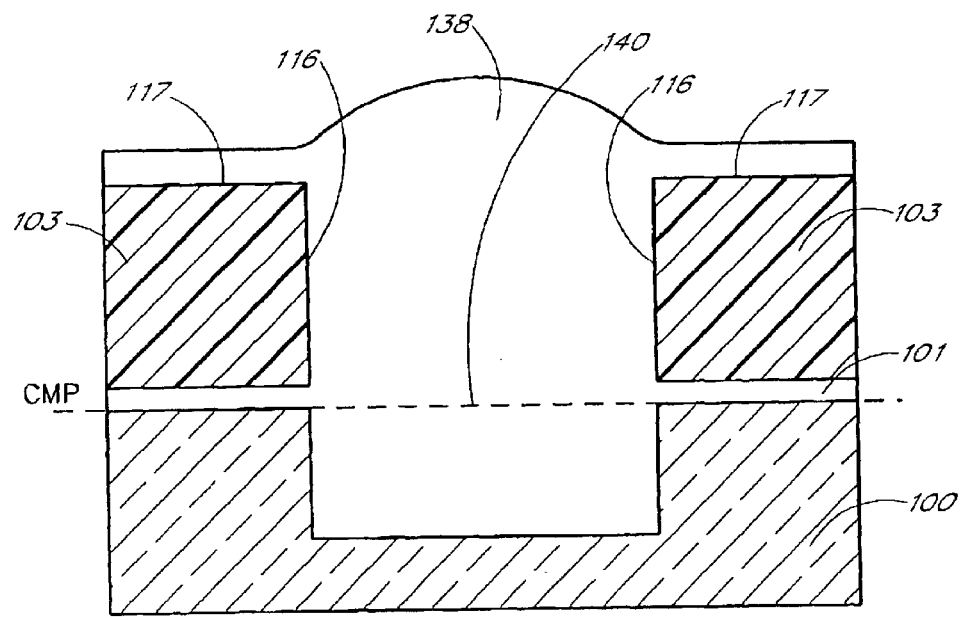
FIG. 6B is a cross-sectional view of the wafer of FIG. 5B, wherein the low temperature oxide precursor has been transformed into an oxide isolation material.

As shown in FIGS. 6A and 6B, exposure to heat dehydrates the silanol polymer and produces silicon dioxide as a reaction product, which forms a silicon dioxide isolation material 138 for the field oxide regions 110.

Figure 7A:
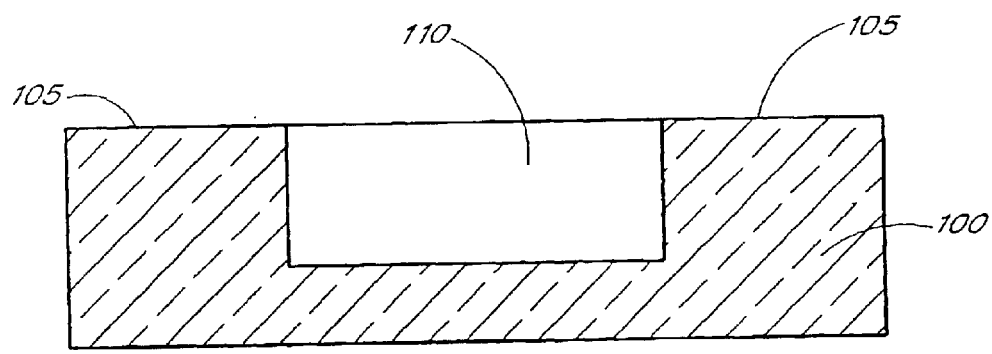
FIG. 7A is a cross-sectional view of the wafer shown in FIG. 6A wherein the masking stack layers and excessive silicon dioxide have been removed by Chemical Mechanical Polishing (CMP) to expose the active areas and the field oxide isolation regions of the wafer.
Figure 7B:
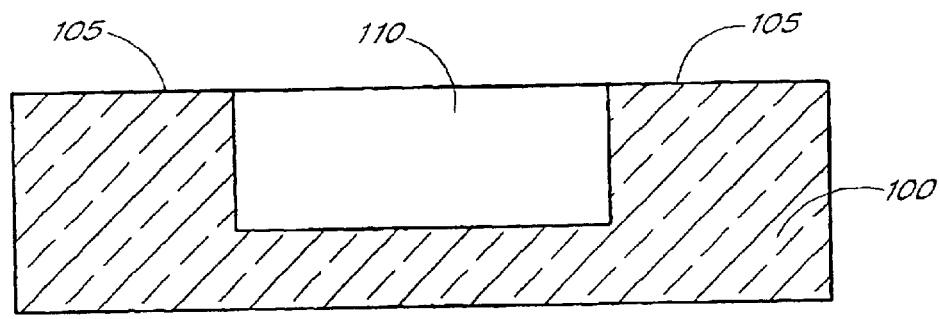
FIG. 7B is a cross-sectional view of the wafer shown in FIG. 6B wherein the masking stack layers and excessive silicon dioxide have been removed by Chemical Mechanical Polishing (CMP) to expose the active areas and the field oxide isolation regions of the wafer.

As illustrated in FIGS. 7A and 7B, after the silanol has been dehydrated or otherwise densified to produce the silicon dioxide isolation material 138, a top portion 135 of the wafer 100, including the masking stack 102 and a portion 140 of the silicon dioxide material 130 formed above the surface level of the silicon substrate 100, is stripped off by preferably using a known chemical mechanical polishing (CMP) technique. During an exemplary CMP process, wafers are mounted on a fixture, pressed against a polishing pad under high pressure, and rotated relative to the pad. A controlled amount of polishing slurry, which is dripped onto the pad, does the chemical and the mechanical polishing. The CMP process produces a significantly planar surface when completed. In this embodiment, the combined effect of the chemical reaction and mechanical abrasion removes the masking stack layers 115 and the excessive silicon dioxide 140 from the surface of the substrate 100 and thereby exposes the active areas 105 and the field oxide isolation regions 110 formed in the substrate 100. Although CMP is the preferred etching process used at this step, an alternative etching process can also be employed, such as wet etching, dry etching or a combination.

It will be understood that the improved trench isolation technique provided by this embodiment uses a low temperature oxide precursor, preferably silanol, to fill previously formed trenches. The silanol polymer 130 can be deposited selectively at low temperatures and, due to its low viscosity at deposition temperatures, the material shows liquid-like flow characteristics and fills the trenches 120 without creating localized high stress points, i.e., voids, seam, etc. After the refill, the silanol is densified (dehydrated) to produce silicon dioxide as an isolation material for the field oxide regions 110.

The inventive process offers advantages of being able to fill very narrow spaces, e.g., a trench width of 0.1 μm, and doing so at relatively low temperatures without creating any local stress build up. As is the case with prior art processes, such local stress points can be etched faster and form divots and surface irregularities, and consequently, deteriorate the isolation characteristic of the field oxide regions 110. Further, the trenches of widely varying widths can be filled simultaneously as the refill process of the preferred embodiment is generally insensitive to the trench profile thereby resulting in a more planar upper surface of the wafer.

Hence, although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention. Consequently, the scope of the present invention should not be limited to foregoing discussions, but should be defined by the appended claims.

What is claimed is:

1. An isolation structure formed on a semiconductor substrate, said isolation structure comprising:

a trench formed in said substrate, said trench having a plurality of walls; and a silanol polymer deposited in said trench, said silanol polymer is in a liquid state at about 0° C. and can be densified to form a seamless isolation material substantially free of localized high stress points without a passivation layer interposed between the trench walls and said isolation material.

2. The isolation structure of claim 1, wherein said silanol polymer can be dehydrated to form a densified network of silicon dioxide.

3. The isolation structure of claim 2, wherein said silanol polymer is deposited in said trench in a manner such that the polymer fills the trench from the bottom to the top.

4. The isolation structure of claim 1, wherein the width of the trench is about 0.1 $\mu$m.

5. The isolation structure of claim 1, wherein the trench walls comprise a plurality of side walls and a floor.

* * * * *

UNITED STATES PATENT AND TRADEMARK OFFICE
CERTIFICATE OF CORRECTION

PATENT NO. : 6,888,212 B2  
DATED : May 3, 2005  
INVENTOR(S) : Ravi Iyer et al.

It is certified that error appears in the above-identified patent and that said Letters Patent is hereby corrected as shown below:

Column 4,  
Line 63, delete "800®C." and insert -- 800°C. --.

Column 5,  
Line 52, delete "french" and insert -- trench --.  
Line 52, delete "1.20" and insert -- 120 --.

Signed and Sealed this

Second Day of May, 2006

JON W. DUDAS  
*Director of the United States Patent and Trademark Office*